United States Patent [19]
Greer

[11] Patent Number: 5,470,787
[45] Date of Patent: Nov. 28, 1995

[54] SEMICONDUCTOR DEVICE SOLDER BUMP HAVING INTRINSIC POTENTIAL FOR FORMING AN EXTENDED EUTECTIC REGION AND METHOD FOR MAKING AND USING THE SAME

[75] Inventor: Stuart E. Greer, Austin, Tex.

[73] Assignee: Motorola, Inc., Schaumburg, Ill.

[21] Appl. No.: 236,320

[22] Filed: May 2, 1994

[51] Int. Cl.⁶ .................................................. H01L 21/44
[52] U.S. Cl. .......................... 437/183; 437/182; 437/189; 437/192; 437/193
[58] Field of Search ..................................... 437/183, 182, 437/189, 192, 193, 203; 257/772

[56] References Cited

U.S. PATENT DOCUMENTS

| | | | |
|---|---|---|---|
| 5,059,553 | 10/1991 | Berndlmaier et al. | 437/183 |
| 5,108,027 | 4/1992 | Warner et al. | 228/254 |
| 5,130,779 | 7/1992 | Agarwala et al. | 257/772 |
| 5,133,495 | 7/1992 | Angulas et al. | 228/180.1 |
| 5,137,845 | 8/1992 | Lochon et al. | 437/183 |
| 5,147,084 | 9/1992 | Behun et al. | 228/56.3 |
| 5,162,257 | 10/1992 | Yung | 437/183 |
| 5,208,186 | 5/1993 | Mathew | 437/183 |
| 5,268,072 | 12/1993 | Agarwala et al. | 437/183 |
| 5,269,453 | 12/1993 | Melton et al. | 228/180.22 |
| 5,310,699 | 5/1994 | Chikawa et al. | 437/183 |

FOREIGN PATENT DOCUMENTS

| | | | |
|---|---|---|---|
| 50269 | 4/1979 | Japan | 257/792 |

OTHER PUBLICATIONS

Grivas, Dennis et al., "The Formation of Cu3Sn Intermetallic on the Reaction of Cu with 95Pb/5Sn Solder," Journal of Electronic Materials, vol. 15 No. 6, Nov. 1986, pp. 355–359.

Bader, W. G. "Dissolution of Au. Ag, Pd, Pt, Cu and Ni in a Molten Tin–Lead Solder," Welding Research Supplement, Dec. 1969, pp. 551–557.

Phase Diagrams of Binary Alloy Systems, by Robert E. Johnson, p. 299 date unknown.

Primary Examiner—Kevin M. Picardat
Attorney, Agent, or Firm—Minh-Hein N. Clark

[57] ABSTRACT

A semiconductor device (32) has an as-deposited solder bump (34) having the intrinsic potential for forming an extended eutectic region for simplified DCA applications. The as-deposited solder bump (34) has first tin layer (40) overlying the UBM of the bonding pad (14) on the device. The first tin layer reacts with a metal layer (36) in the UBM to form an intermetallic for adhering the solder bump to the bonding pad. A thick lead layer (42) overlies the first tin layer to provide the substantial component of the solder bump. A second tin layer (44) overlies the lead layer to provide localized eutectic formation at the top surface of the bump during reflow. A device having at least this solder bump structure can be directly attached to either ceramic or PC board substrates. Additional layers of tin and /or lead may be supplemented to the basic bump structure to optimize the eutectic formation rate.

13 Claims, 5 Drawing Sheets

SEMICONDUCTOR DEVICE SOLDER BUMP HAVING INTRINSIC POTENTIAL FOR FORMING AN EXTENDED EUTECTIC REGION AND METHOD FOR MAKING AND USING THE SAME

FIELD OF THE INVENTION

The present invention relates to flip chip solder bumps on a semiconductor device, a method for making those solder bumps, and a method for testing the semiconductor device generally; and more specifically to solder bumps having extended eutectic regions, a method for making the same, and a method for testing a semiconductor device having these solder bumps to provide known good die.

BACKGROUND OF THE INVENTION

Direct chip attach (DCA) or high temperature flip-chip bonding is currently used in the semiconductor industry to physically and electrically connect a semiconductor chip to the next level of interconnection wiring. For example, the next level interconnect may be a ceramic chip carrier or an organic printed circuit (PC) board. One method of DCA involves depositing solder bumps on wettable bonding pads on a semiconductor die. These solder bumps are then soldered to traces on the next level interconnect to link the die's internal functional portions to the next level interconnect.

The bonding pads provide both the physical bond to the die surface and the electrical link into the actual circuitry of the semiconductor die. Additionally, the bonding pads provide an adhesive connection to the subsequently deposited solder bumps. The wettable bonding pads are usually prepared by selectively depositing a series of localized pad limiting metallurgy (PLM) or under bump metallurgy (UBM) by evaporation through a mask onto a semiconductor wafer. Alternatively, a blanket film of these materials can be deposited directly onto the wafer and then selectively etched to leave the wettable bonding pads in the selected areas. The metallurgy is typically composed of a chrome-copper-gold stack, although titanium or titanium/tungsten have been used as alternatives to chrome, and nickel has been used as an alternative to copper. The gold layer at the top of the stack prevents oxidation of the copper in these PLMs. The total thickness of the layers is typically approximately 5,000 to 20,000 Angstroms.

After the PLM has been deposited, the solder bumps are formed in two steps using the same or a similar mask as that used to form the wettable bonding pads. Typically, this bump material is composed of lead and tin which are deposited as a two-layer stack. In the first step lead and tin are deposited in the following order. A layer of lead, approximately 100–125 microns, is deposited first followed by a separate layer of tin, approximately 2.5 to 18 microns. As deposited, the shape of the solder bumps resembles a truncated column with a thick lead base and a thin tin cap.

The second step of the solder bump formation involves a high temperature reflow of the as-deposited bumps at temperatures in excess of 355° C. to complete the compositional blending of the lead and tin layers. The near-spherical bump produced by this method typically contains about 2–10% tin, depending on the starting deposited thickness ratios. During the reflow process, the tin layer at the top of a as-deposited solder bump diffuses through the lead layer to form a copper/tin intermetallic at the interface of the solder bump and the UBM. This intermetallic, typically $Cu_6Sn_5$ and or $Cu_3Sn$, is strong but brittle and is necessary to provide adhesion of the solder bump to the chrome-copper-gold pad metallurgy. FIG. 1 illustrates, in cross-section, a portion of a semiconductor die 10 having a solder bump 12 as formed by the process as known in the art. The solder bump 12 is deposited overlying the UBM of the bonding pad 14. The UBM is composed of a chrome layer 16, a chrome-copper layer 18, and a copper/tin intermetallic layer 20. The copper/tin intermetallic layer 20 results from the reflow process. The gold that was deposited in the chrome-copper-gold stack prior to reflow diffuses quickly through the metals during reflow so that it effectively disappears. As can be seen in FIG. 1, the solder bump is electrically connected to the underlying metal trace 22 which overlies the semiconductor substrate 24. Passivation layers 26, 28, and 30 protect the die circuitry. The UBM also seals the edges of the passivation layers.

In attaching a semiconductor die having solder bumps to a ceramic substrate or chip carrier, the bumped die is aligned to mating solder pads on the substrate. Then all the solder bumps are remelted in a second reflow process to join the die to the substrate. The reflow temperature is typically greater than 355° C. Organic acid fluxes are usually dispensed around the bumps to reduce surface oxides and aid in the joining process.

If direct joining of the semiconductor die having solder bumps to copper traces on an organic PC board is desirable, lower temperature joining processes must be used to achieve the die-to-organic board attachment without damaging the PC board through exposure to excessive heat. One solution to attaching a high lead-content solder bumped semiconductor die to an organic PCB board is to selectively deposit a eutectic lead-tin solder onto specially fabricated oversized pads at the end of the traces on the board to provide large eutectic surfaces for DCA. With this option, a lower temperature can be used to join the die to the PC board because only melting and wetting of the eutectic metals on the pads on the board to the high temperature solder bumps on the die is required. The high temperature bumps do not have to melt during this process. The melted/reflowed eutectic solder wets to the solder bumps and joins them to the PC board.

Several major disadvantages are associated with the method of DCA as currently being practiced. The selective deposition of a eutectic solder pad onto the copper traces is an expensive process and one that is difficult to control due to the precision required. Complex PC boards increase the level of difficulty of this selective deposition process as well as cost. Moreover, since these eutectic solder pads are necessarily wider than the actual traces, the pitch or spacing between the traces must be increased to accommodate the pads. Since the pitch of the traces must be maintained at some minimum spacing, further reduction of die size or bump density cannot be realized which is contrary to the industry trend of miniaturization and increased board density.

SUMMARY OF THE INVENTION

In one embodiment of the invention, a semiconductor device has a bonding pad with multiple metal layers to provide a solder bump having a potential to form an extended eutectic region for direct chip attach (DCA) applications. A first metal layer overlies the bonding pad to provide adhesion for subsequent metal layers. A second metal layer overlies the first metal layer. The first and second metal layers compose the under bump metallurgy (UBM). A solder bump composed of a first tin layer, a lead layer, and a second tin layer overlies the UBM. The first tin layer overlies the second metal layer, wherein the first tin layer and the second metal layer are compatible such that an intermetallic of the second metal layer and the first tin layer may be formed. The lead layer overlies the first tin layer, wherein the lead layer is substantially thicker than the first tin layer, such that the lead layer gives height to the device when mounted in DCA. The second tin layer overlies the lead layer, wherein the second tin layer is thinner than the lead layer to provide localized eutectic formation at the top of the bump during solder reflow.

The invention also provides a method for making a solder bump on a bonding pad of a semiconductor device, wherein the solder bump has a potential to form an extended eutectic region for direct chip attach (DCA). A first metal layer is provided overlying the bonding pad to provide adhesion of the solder bump to the semiconductor device. Then a second metal is provided overlying the first metal layer. The first and second metal layers compose the UBM upon which a solder bump is formed. A first tin layer is formed in a vacuum environment to overlie the second metal layer, wherein the first tin layer and the second metal layer are mutually soluble such that an intermetallic of the second metal layer and the first tin layer may be formed. Without breaking vacuum a lead layer is formed overlying the first tin layer, wherein the lead layer is substantially thicker than the first tin layer to provide a substantial component of the solder bump. Then a second tin layer is formed overlying the lead layer, without breaking the vacuum environment, wherein the second tin layer is thinner than the lead layer to provide localized eutectic formation at the top of the bump during solder reflow.

Another embodiment of the invention provides a method for performing direct chip attach. A semiconductor device is provided having the solder bump which has the potential for forming an extended eutectic region in accordance with an embodiment of the invention. The semiconductor device is positioned with the solder bump overlying and facing a conductive trace on a mounting substrate. The solder bump and the conductive trace are aligned such that the solder bump is substantially centered over the conductive trace. The solder bump is brought into physical contact with the conductive trace. Then the solder bump is heated to a temperature substantially in a range of 183° C. to 250° C., wherein a eutectic liquidus solder composed of the second tin layer and a portion of the lead layer is formed at a surface of the solder bump. The eutectic liquidus solder wets to the conductive trace to join the semiconductor device to the mounting substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

Structural elements having the same or substantially similar functions are labeled using the same or like reference numerals.

DETAILED DESCRIPTION OF A PREFERRED EMBODIMENT

Figure 1:
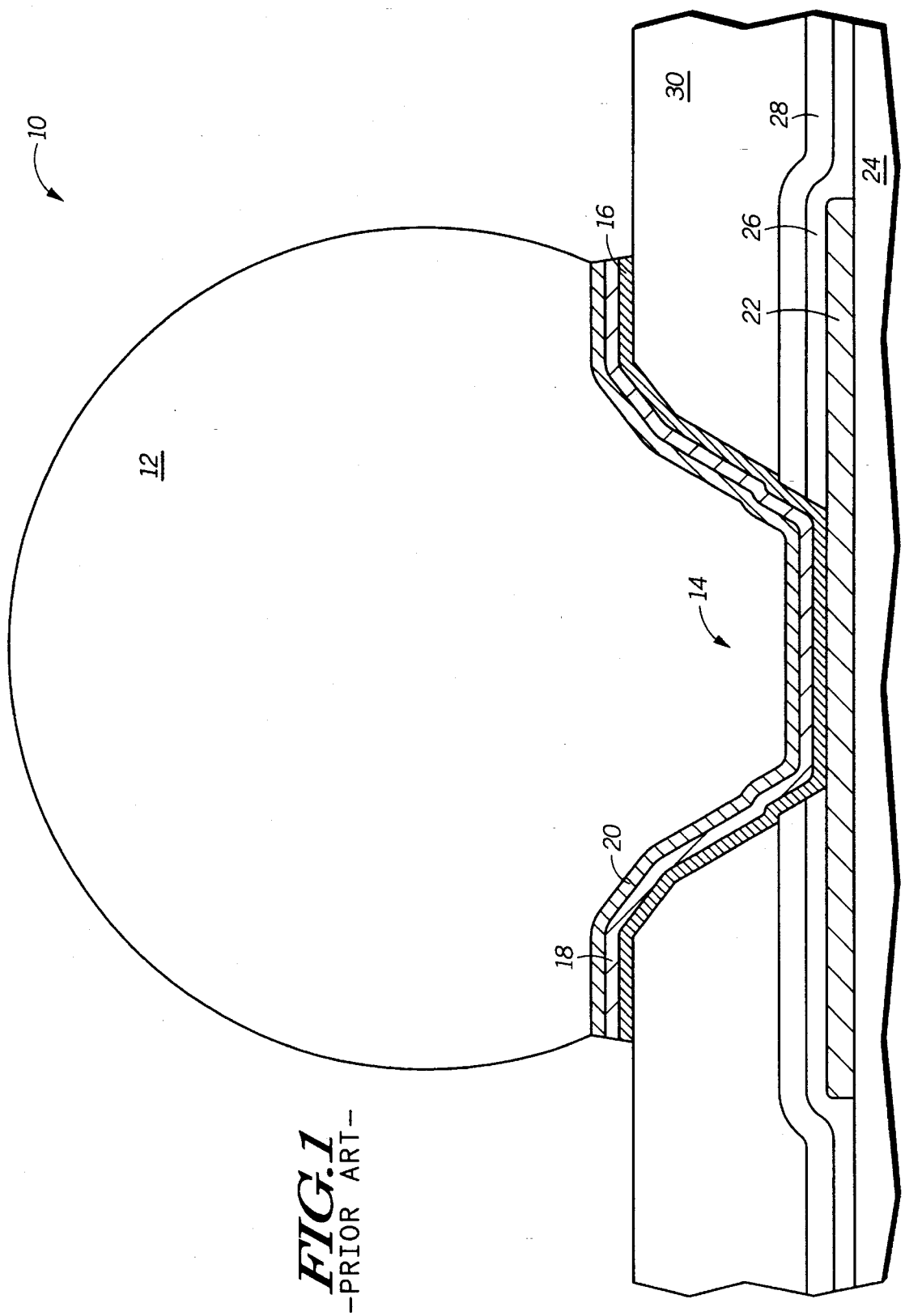
FIG. 1 illustrates, in cross-section, an enlarged view of a flip chip solder bump on a semiconductor device as known in the art.
Figure 2:
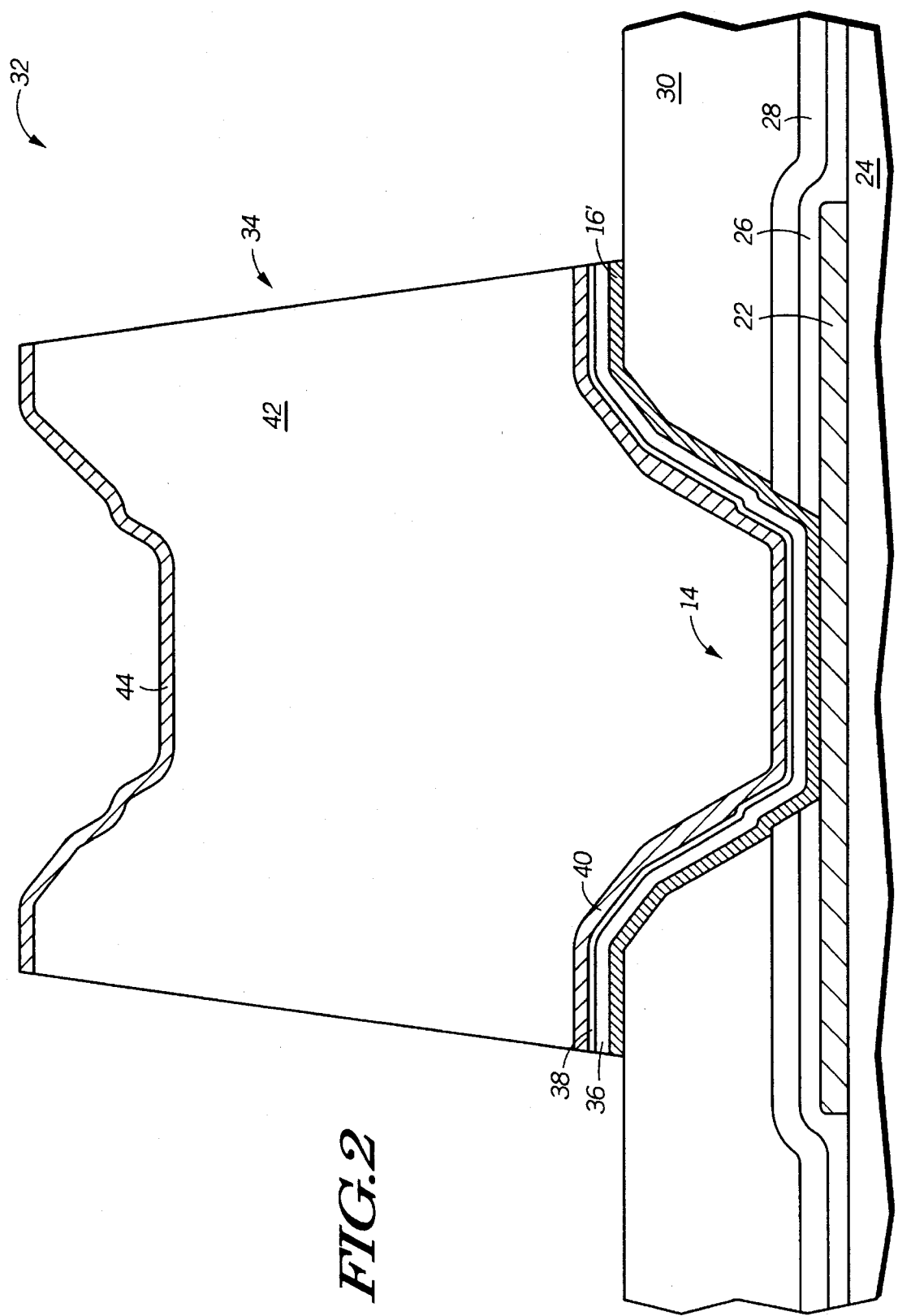
FIG. 2 illustrates, in cross-section, an enlarged view of a solder bump having an intrinsic potential to form an extended eutectic region in a first embodiment of the invention.

Different embodiments of the present invention are now discussed with reference to the figures. FIG. 2 illustrates, in cross-section, an enlarged view of a portion of a semiconductor device 32 to show an as-deposited solder bump 34 having an intrinsic potential to form an extended eutectic region in a first embodiment of the invention. Although the figure only depicts a single solder bump for ease of illustration, it should be understood that a complete device would have a plurality of solder bumps corresponding to the number of bonding pads on the device.

In this first embodiment as illustrated by FIG. 2, the semiconductor device has the chrome-copper-gold PLM (layers 16', 36 and 38, respectively) overlying the metal line 22. In practice, there is a thin chrome-copper phase layer (not illustrated) between the chrome layer 16' and the copper layer 36. The PLM or UBM can be deposited using conventional equipment and deposition techniques which are well known in the art. After the PLM layers are formed, then layers of the solder bump 34 are deposited in a single evaporator without breaking vacuum. A first tin layer 40 is deposited immediately overlying or adjacent to the PLM. It is important that this first tin layer 40 be sufficiently thick to ensure a good intermetallic bond in subsequent processing. The mechanism of the intermetallic formation will become readily apparent in subsequent discussion. The first tin layer 40 should be formed with a thickness approximately in a range of 2,000 to 12,000 angstroms (0.2 to 1.2 microns) in practicing the invention. The deposition thickness of the first tin layer 40 can be controlled by deposition rate monitors of the equipment or by other suitable controls which are a part of the evaporation equipment.

Next, a lead layer 42 is deposited overlying the first tin layer 40. The lead layer 42 should have a thickness in a range of 100 to 150 microns. This relatively thick lead layer 42, as compared to the first tin layer 40, forms the bulk component of the solder bump for DCA. Then a second tin layer 44 is deposited overlying the lead layer 42. The second tin layer 44 should have a thickness substantially in a range of 2.5 to 18 microns. The upper thickness limit of the second tin layer 44 is impractical with existing evaporation equipment. It should be understood that the thickness range of this second tin layer 44 may be varied from the stated range, subject to advances in the evaporation equipment, depending on the desired method of use, which will be discussed in more detail subsequently. In using current evaporation equipment, however, it is critical that the tin 40-lead 42-tin 44 stack be formed without breaking vacuum to avoid the formation of tin oxide between the first tin layer 40 and the lead layer 42. Tin oxide at that interface will tend to degrade the reliability and strength of the solder bump, often causing the bump to fracture at that interface when subjected to stress. A vacuum pressure of approximately $1\times10^{-6}$ mbar has been found to be sufficient for practicing the invention.

The solder bumped semiconductor device 32 in this first embodiment of the present invention thus comprises a PLM composed of chrome 16', copper 36, and gold 38, and a solder bump composed of separate layers of tin 40, lead 42, and tin 44. The as-deposited solder bump 34 of the present invention differs from that of the prior art due to the presence of the first tin layer 40 adjacent to the PLM. The need for a high temperature solder bump homogenization reflow at 355° C. as practiced currently in the art is eliminated due to this first tin layer 40. Instead, a semiconductor device having this particular as-deposited solder bump structure may be directly attached to the next level interconnect using a low temperature reflow process as follows.

The as-deposited solder bumped semiconductor device may be attached to a mounting substrate, such as a ceramic chip carrier or an organic PC board, using a reflow temperature substantially in a range of 183° C. to 250° C. to join the device directly to traces, typically copper, on the substrate. To accomplish this joining process, the device is aligned and centered over the trace with the solder bumps overlying and facing the traces. The bumps are then placed in direct contact with the traces before reflowing. The solder bumps themselves have the intrinsic potential to form extended eutectic regions at the reflow temperature to ensure good intermetallic bonding of the solder bumps to the bonding pads and good solder joining of the solder bumps to the copper traces. During the reflow process of chip attach, the first tin layer 40 reacts with lead atoms from the adjacent lead layer 42 at temperatures greater than 183° C., which is the melting point of a eutectic solder having 63% tin and 37% lead, to form a molten tin-rich liquidus adjacent to the PLM. In this environment, gold atoms in gold layer 38 quickly diffuse away from the PLM. Other metals which diffuse quickly through solder, such as thin layers of silver or palladium, would also have this same characteristic and could thus be used in place of gold. The dissolution rate of these fast diffusing metals range from 0.01 μm/sec to 1.0 μm/sec for a temperature range of 200° C. to 250° C. Tin atoms from the first tin layer 40 rapidly migrate to the thick copper layer 36 of the PLM to form a continuous layer of copper-tin intermetallic material. This copper-tin intermetallic is a vital bonding element between the solder bump 34 and the PLM. The intermetallic formed is typically $Cu_6Sn_5$ and/or $Cu_3Sn$, which is almost a one to one ratio of the elements. Therefore, it is important that the first tin layer be sufficiently thick to form a sufficient amount of intermetallic with the copper layer to ensure good adhesion between the solder bump and the bonding pad of the semiconductor device. If, however, the first tin layer is too thick such that the number of tin atoms exceeds the number of available copper atoms, then all of the copper will react with the tin to form the copper-tin intermetallic with the excess tin atoms remaining in the solder bump. However, this event is unlikely to occur during actual practice as more copper is usually deposited than the first tin layer so that all of the tin atoms in the first tin layer is utilized to form the intermetallic. If there is excess tin, this amount is insufficient to significantly change the characteristics of the solder bump.

This method of intermetallic formation is different from and superior to the prior art method. In practicing the present invention, the copper-tin intermetallic is formed during the DCA process itself, rather than during the preliminary homogenizing reflow step done in the prior art. Moreover, the rate of formation of copper-tin intermetallic in the prior art is dependent on the diffusion of tin from the top of the bump through the thickness of the lead layer before intermetallic formation can occur at the copper interface, whereas with the present invention, the tin atoms necessary for the intermetallic formation are adjacent to the PLM so the time required for the copper-tin intermetallic formation is decreased. Thus, the intermetallic formation provided by the present invention is more efficient than that of the prior art.

In addition to the copper-tin intermetallic forming during the DCA due to the presence of the first tin layer 40, the second tin layer 44 at the top of the as-deposited solder bump 34 reacts with lead atoms from the adjacent lead layer 42 to form an extended eutectic liquidus pool at the top of the bump 34 while the bulk of the solder bump, which is composed mainly of lead, does not melt. Tin is available for this localized eutectic formation because the presence of the first tin layer 40 at the bottom of the bump 34 retards the diffusion of tin from the second tin layer 44 through the thick lead layer 42. Thus, the thickness of this top solder liquidus necessary to join the semiconductor device to traces on a substrate can be controlled by varying the thickness of the second tin layer 44. Because the as-deposited solder bump has the intrinsic potential to form an extended eutectic region at the top of the bump when reflowed, the need for selective eutectic deposition or plating of the traces on organic PC boards is eliminated. The solder liquidus that is formed through the reflow temperature ranging from 183° C. to 250° C. allows the bumps to be joined directly to the traces at a temperature that does not thermally degrade the organic PC board. While a eutectic liquidus is formed at 183° C., slight compositional variations in the liquidus may occur at temperatures greater than 183° C. However, once the liquidus is formed, these slight percentage variations do not materially affect the proposed method of direct chip attach.

Figure 3:
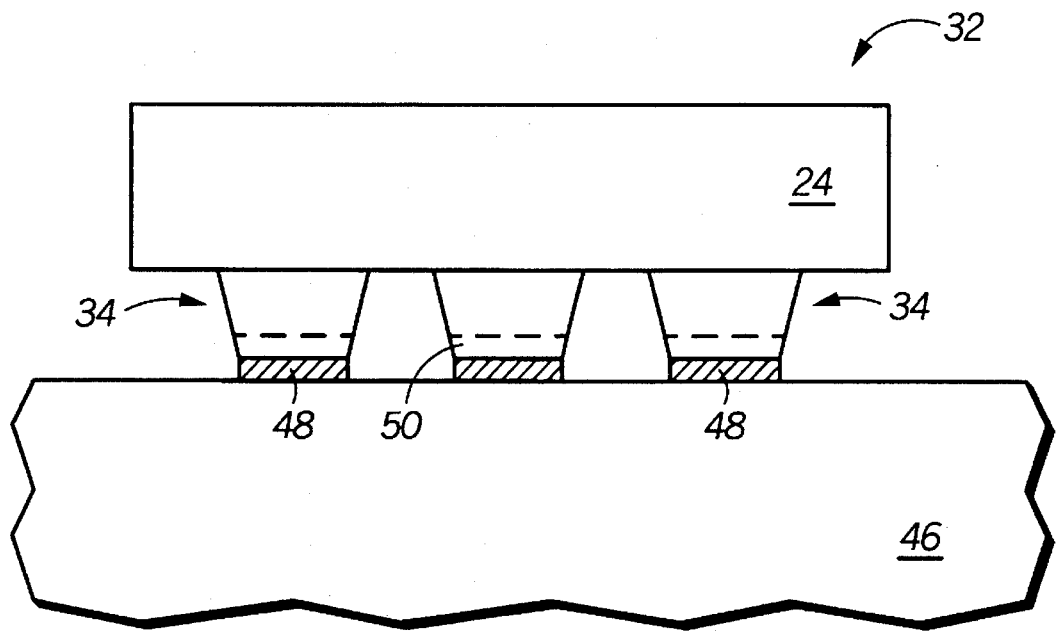
FIG. 3 illustrates, in cross-section, a semiconductor device having solder bumps, in accordance with invention, mounted to a substrate.

The thickness of the second tin layer determines the thickness of the resulting eutectic liquidus layer, which then flows and wets onto the traces of the mounting substrate. Given this method, it is preferable to evaporate a sufficiently thick tin layer to react with adjacent lead atoms to form a sufficiently thick eutectic layer for the intended purpose. A thick eutectic layer will result in a strong permanent bond while a thin eutectic layer will allow easy removal of the die after attachment. Thus, if permanent joining of the solder bumped semiconductor device to a mounting substrate is desired, the eutectic liquidus layer should be as thick as practicable. This intended permanent joining is illustrated in FIG. 3. As illustrated, semiconductor device 32 is joined to mounting substrate 46 having conductive traces 48 thereon. Mounting substrate 46 could be either a ceramic chip carrier or an organic PC board, such as FR-4 which is an epoxy glass cloth composite material. The dotted line illustrates the eutectic solder region formed during the reflow process. As stated previously, a eutectic liquidus layer forms when temperatures exceed the melting point of a eutectic solder (63% tin, 37% lead). This liquidus solder wets to the traces 38 and then solidifies to join the device to the board. Thus, it is important that this liquidus region be sufficiently thick to provide a reliable solder joint between the device and the mounting substrate. Because the liquidus formation is localized at the top of the as-reflowed bump, the rest of the bump shape remains unaffected and the top of the bump remains flat, providing control of the height and good interfacial contact between the semiconductor die 24 and the mounting substrate 46. In the practicing invention, it is possible to fill this gap with a polymeric material to enhance to the reliability of the finished device.

Figure 4:
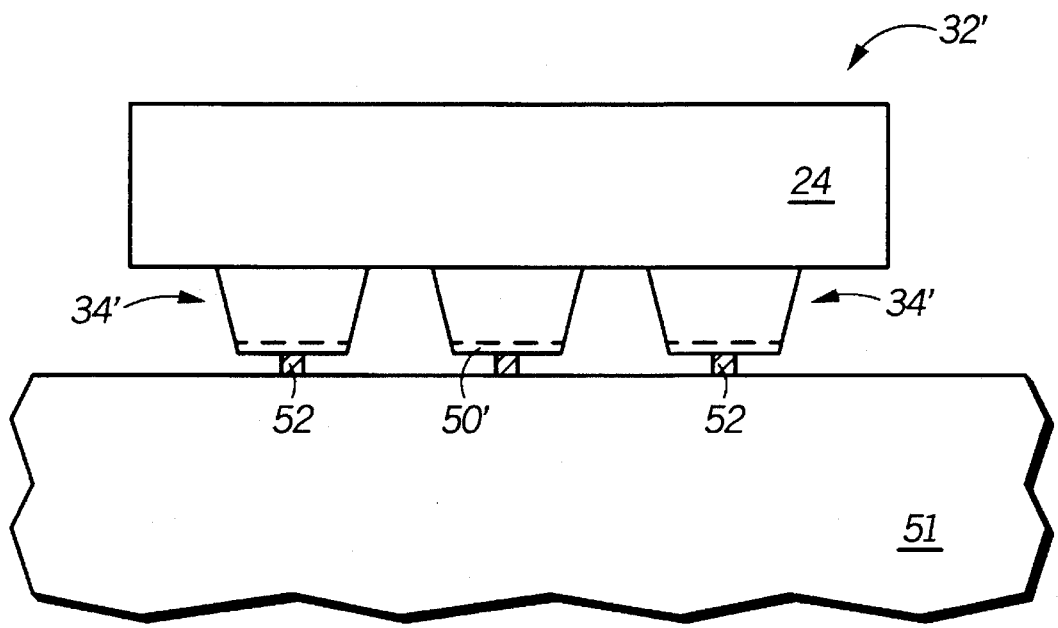
FIG. 4 illustrates, in cross-section, a semiconductor device having solder bumps, in accordance with the invention, temporarily mounted to a test substrate for testing purposes

If, however, testing and/or burn-in of the solder bumped device is desired to provide known good die for other applications, such as multichip modules, then the eutectic layer should be as thin as practicable to allow easy removal of the bumped device from the testing substrate without damaging the solder bumps themselves. Such an application is illustrated in FIG. 4 in which semiconductor device 32' is electrically connected to test traces 52 on test substrate 51. The dotted line represents a minimally thick eutectic region 50' required to physically bond the semiconductor device to the test traces 52 on the test board. If the wettable area on the test trace 52 is limited to approximately 10% to 20% of the area of the top of the bump, a "tack" joint will form between the solder bumps and the test traces. The test substrate or board would be specially designed to evaluate the electrical performance of die under thermal and electrical stress. After completion of the testing and burn-in, the known-good-die 32' can be physically removed from the test board without materially damaging the solder bumps. Such removal may be accomplished by application of shear or tensile stresses to the tack joints or by chemical etching or other appropriate methods. The known-good-die may then be reattached to the next level interconnect. As an option, the known-good-die may undergo a reflow process to homogenize the tin and lead still remaining in the bumps, which can then be directly attached to a ceramic or high temperature mounting substrate.

The need for special eutectic bonding pads on the supporting organic PC board substrate is eliminated due to the intrinsic potential of the as-deposited solder bump to form an extended eutectic region during reflow which enables successful and reliable attachment of the solder bumps to traces on the mounting substrate. Thus, substantial space savings can be realized on the PC board because the pitch between the traces can be minimized. Moreover, the expensive selective eutectic plating process and costs associated therewith may be totally avoided by practicing the present invention.

Figure 5:
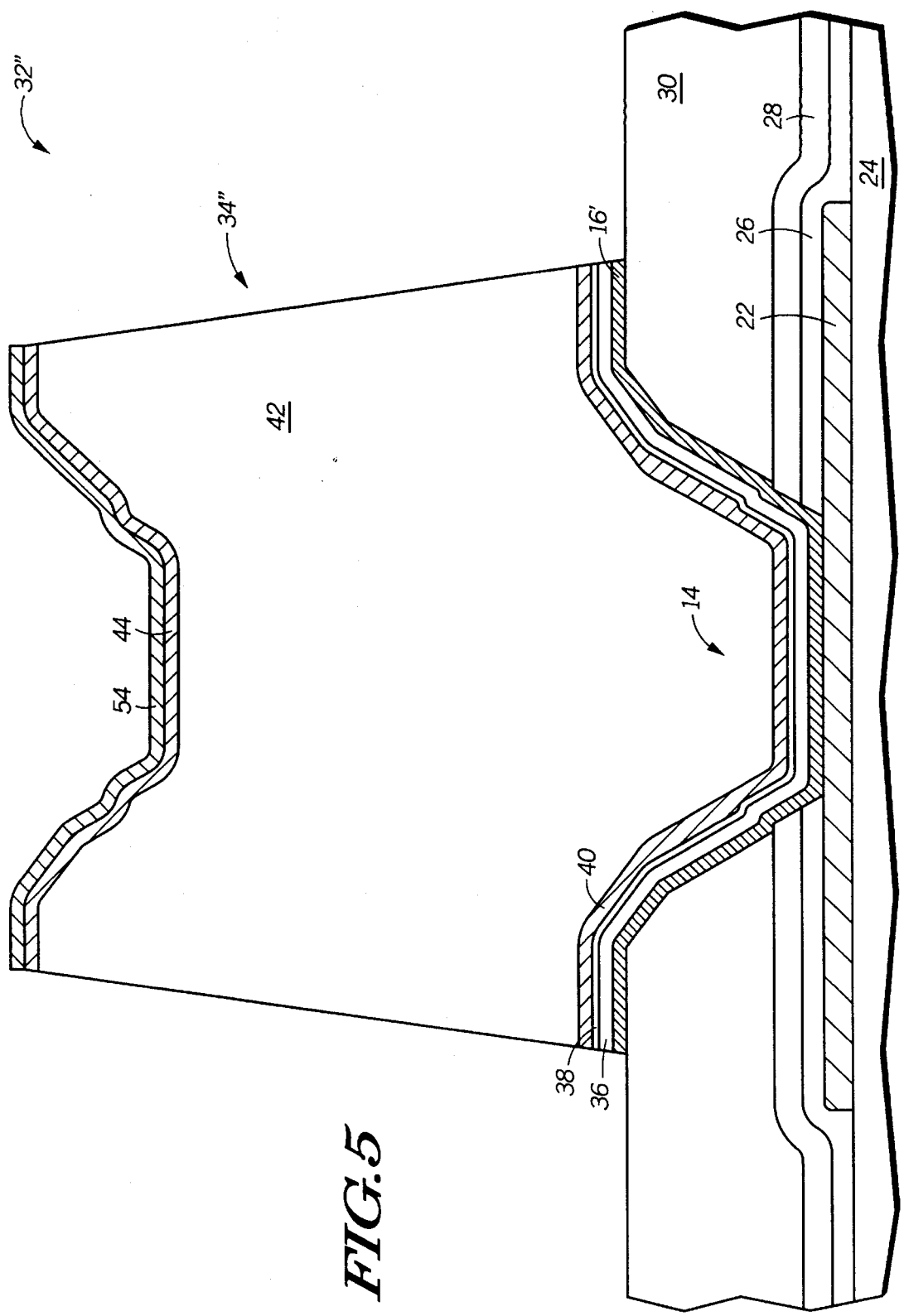
FIG. 5 illustrates, in cross-section, an enlarged view of a solder bump having an alternative intrinsic potential to form an extended eutectic region in a second embodiment of the invention.

FIG. 5 illustrates, in cross-section, an enlarged portion of a semiconductor device 32" having an as-deposited solder bump 34" in a second embodiment of the present invention. This second embodiment is substantially similar to that of the first embodiment illustrated in FIG. 2 but with an additional second lead layer 54 overlying the second tin layer 44. The second lead layer 54 is deposited without breaking vacuum in the evaporator and in an approximate ratio of 4 parts lead to 6 parts tin with respect to the second tin layer 44. Thus, the second lead layer 54 would be slightly thinner than the second tin layer 44. This second embodiment provides a different diffusion path for the tin atoms than the first embodiment in that tin will migrate through the second lead layer 54 toward the traces on the mounting substrate instead of into the bulk lead layer 42 This 4-layer stack, tin 40 - lead 42 -tin 44- lead 54, offers a more rapid formation of eutectic liquidus solder on the top of the as-reflowed bump during DCA processing when the reflow temperature equals to or exceeds 183° C., thus allowing quicker joining to the traces on an organic board during DCA attach processing. Hence, the exposure of sensitive board elements to elevated temperatures is limited.

In an alternative embodiment not illustrated, an additional layer of lead is interposed between the first tin layer 40 and the PLM, to create an as-deposited solder bump stack of lead-tin-lead-tin. This additional lead layer at the bottom of the stack should be in an approximate ratio of 4 parts lead to 6 parts tin forming a structure that allows quicker joining of the bump to the PLM at temperatures equal to or greater than 183° C. In this structure, tin atoms from the first tin layer 40 diffuses through the additional lead layer towards the PLM structure and forming a eutectic in the process. Alternatively, a third layer of lead may be added to this embodiment to form a 5-layer stack of lead-tin-lead-tin-lead. At a temperature equal to or greater than the melting point of the eutectic solder, tin diffuses through the nearest lead layers toward both the conductive trace on the mounting substrate and the PLM, thus optimizing the time for the interfaces to react and form effective joints.

Figure 6:
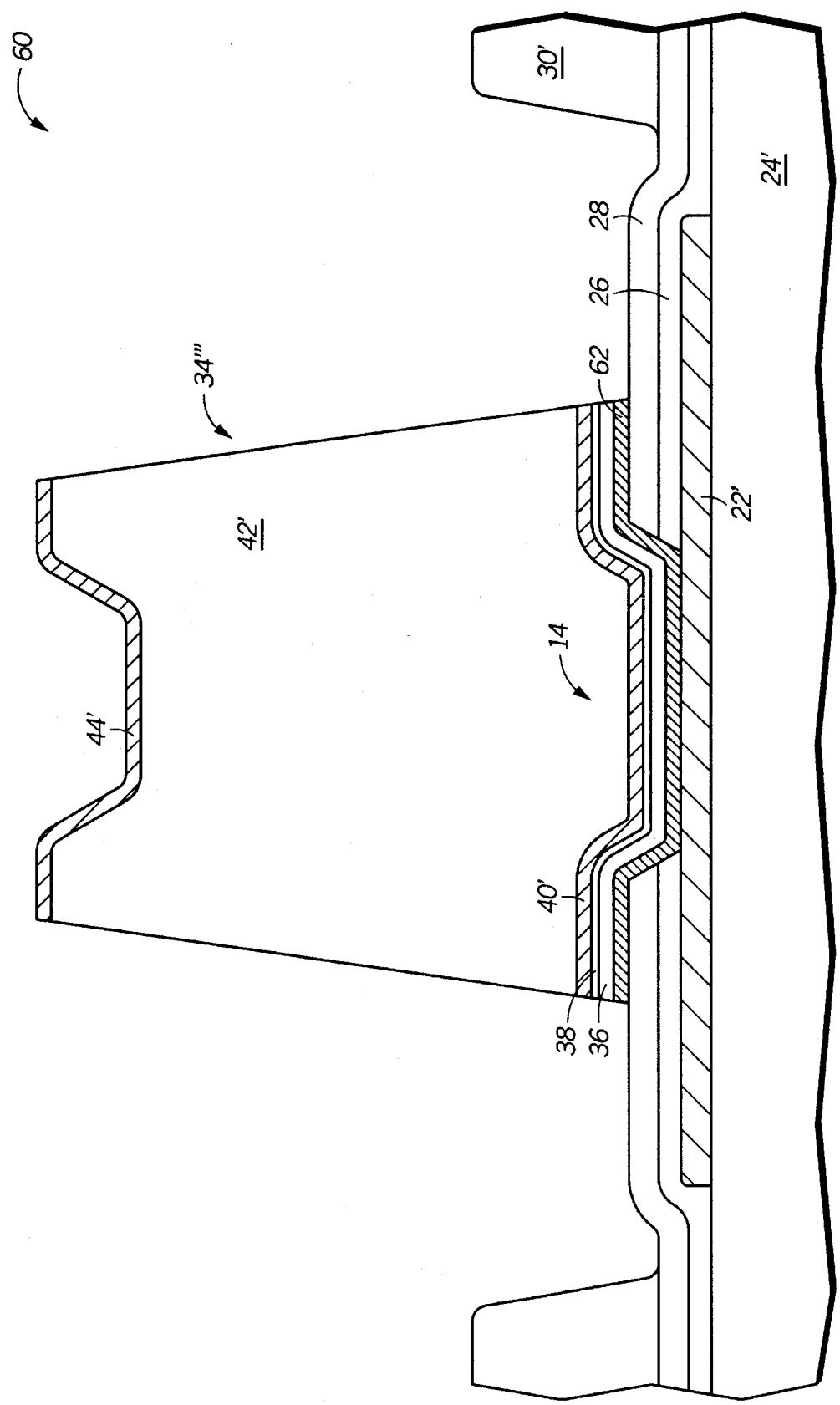
FIG. 6 illustrates, in cross-section, an enlarged view of a solder bump having yet another alternative intrinsic potential to form an extended eutectic region in a third embodiment of the invention.

FIG. 6 illustrates, in cross-section, an enlarged view of a portion of a semiconductor device 60 in yet another embodiment of the present invention. This embodiment is substantially similar to that of the first embodiment illustrated in FIG. 2. However, in this embodiment, the PLM is composed of a titanium or titanium-tungsten layer 62. Titanium adheres well to nitride and oxide but not to polyimide, so passivation layer 30', representing polyimide, is recessed from the PLM. The second metal layer 36 can be either copper or nickel, while the third metal layer 38 is typically gold or other thin film fast metal diffusers in solder to prevent the second metal layer from oxidizing. In practice, there is a thin titanium-copper or titanium-nickel phase layer (not illustrated) between the titanium or titanium-tungsten layer 62 and the second metal layer 36. The as-deposited solder bump 34''' is composed of the tin-lead-tin stack as discussed previously. Although not specifically illustrated, it is also possible to add a second lead layer overlying the second tin layer 44' or interposing a lead layer between the first tin layer 40' and the gold layer 38, or any of the other tin-lead stack combinations as discussed previously.

In an optional step, consistent with any of the foregoing as-deposited solder bump structures, a low temperature preliminary reflow step can be performed for a predetermined amount of time to pre-define an extended eutectic region on each and every solder bump prior to attachment to an organic PC board. The temperature range for this preliminary reflow step should be in a range of 183° C. to 225° C., and a time of approximately 2 to 6 minutes should be sufficient. This preliminary reflow may be performed on an individual semiconductor device or on an entire wafer. The direct chip attach can then be conducted at a later time.

The foregoing description and illustrations contained herein demonstrate many of the advantages associated with the present invention. In particular, it has been revealed that a semiconductor device solder bump having an intrinsic potential for forming an extended eutectic region can be made to simplify the direct chip attach process and to provide a means for testing semiconductor devices for known-good-die applications. The need for special eutectic bonding pads on the supporting organic PC board substrate is also eliminated due to the intrinsic potential of the as-deposited solder bump to form an extended eutectic region during reflow which enables successful and reliable attachment of the solder bumps to traces on the PC board. Moreover, the elimination of the special and selective eutectic plating of traces allows a finer pitch between the traces to be used so that semiconductor devices need not be pad limited. Moreover, the difficult to control and costly process step of selective eutectic plating of PC boards is no longer necessary. Yet another advantage is that a high temperature homogenizing reflow step at 360° C. can be avoided altogether. The flat top of the as-deposited solder bump also provides a good contact interface to traces on the mounting substrate. Thus, a semiconductor device having this particular as-deposited solder bump structure is eminently suitable for mounting to either a ceramic chip carrier or an organic PC board substrate. This lower DCA temperature allows the device to be attached to either a ceramic or a PC board substrate without thermal degradation to the organic PC board.

Thus it is apparent that there has been provided, in accordance with the invention, a semiconductor device having an as-deposited solder bump structure and a method for making and using the same that fully meet the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited in any way to direct chip attach to only ceramic chip carriers or organic PC boards. Other mounting substrates for bare die may also be suitable. In addition, the invention is not limited to joining semiconductor chips to appropriate carriers, but may also be used to attach other circuit elements, such as resistors, capacitors, inductors, connectors, etc. to either high or low temperature mounting substrates. It should be also be understood that the invention allows the option to form a homogenized high temperature (2% to 10% tin) bump although it is advantageous to eliminate this step for many applications. This flexibility means that the same deposition tool sets can be used to produce equivalent bumps for either low temperature, direct-chip attach applications or high temperature ceramic joining applications. Furthermore, while a preferred reflow temperature range of 183° C. to 250° C. is stated for practicing the invention in doing DCA, as-deposited solder bumped devices made in accordance with the present invention may also be directly reflowed at higher temperatures depending on the thermal capacity of the mounting substrate. Therefore, it is intended that this invention encompass all such variations and modifications falling within the scope of the appended claims.

I claim:

1. A method for making a solder bump on a bonding pad of a semiconductor device, comprising the steps of:
    providing a first metal layer overlying the bonding pad to provide adhesion of the solder bump to the semiconductor device;
    providing a second metal layer overlying the first metal layer;
    forming in a vacuum environment a first tin layer overlying the second metal layer, wherein the first tin layer and the second metal layer are mutually soluble such that an intermetallic of the second metal layer and the first tin layer may be formed;
    in situ forming a lead layer overlying the first tin layer without breaking the vacuum environment, wherein the lead layer is thicker than the first tin layer; and
    forming a second tin layer overlying the lead layer without breaking the vacuum environment, wherein the second tin layer is thinner than the lead layer to provide localized eutectic formation at a top of the solder bump during solder reflow.

2. The method of claim 1, wherein the step of providing the first metal layer comprises providing a metal selected from a group consisting of: chrome, titanium, and tungsten.

3. The method of claim 1, wherein the step of providing the second metal layer comprises providing a metal selected from a group consisting of: copper and nickel.

4. The method of claim 1, further comprising the step of providing a third metal layer overlying the second metal layer to prevent the second metal layer from oxidizing, the third metal layer being selected from a group consisting of: gold, silver, and palladium.

5. The method of claim 1, wherein the step of forming the first tin layer comprises depositing tin in an evaporator, wherein the first tin layer has a thickness approximately in a range of 2,000 to 12,000 angstroms.

6. The method of claim 1, wherein the step of forming the second tin layer comprises evaporating tin to a thickness approximately in a range of 2.5 to 18 microns.

7. The method of claim 1, wherein the step of forming the lead layer comprises evaporating lead to a thickness approximately in a range of 100 to 150 microns.

8. The method of claim 1, further comprising the step of:
    depositing, without breaking the vacuum environment, a second lead layer overlying the second tin layer to an approximate ratio of 4 parts lead to 6 parts tin with respect to the second tin layer.

9. The method of claim 1, further comprising the step of:
    forming, in the vacuum environment, a second lead layer interposed between the first tin layer and the second metal layer, the second lead layer having an approximate ratio of 4 parts lead to 6 parts tin with respect to the first tin layer.

10. The method of claim 1, further comprising the step of:
    exposing the solder bump for a selected time to a temperature approximately in a range of 183° C. to 225° C. to form a predefined eutectic region at a surface of the solder bump.

11. A method for performing direct chip attach comprising the steps of:
    providing a semiconductor device having a first metal layer overlying a bonding pad to provide adhesion for subsequent metal layers to the semiconductor device, a second metal layer overlying the first metal layer, and a solder bump comprising a first tin layer overlying the second metal layer, wherein the first tin layer and the second metal layer are mutually soluble such that an intermetallic of the second metal layer and the first tin layer may be formed, a lead layer overlying the first tin layer, wherein the lead layer is thicker than the first tin layer, and a second tin layer overlying the lead layer, wherein the second tin layer is thinner than the lead layer to provide localized eutectic formation at a top surface of the solder bump during solder reflow;
    positioning the semiconductor device with the solder bump overlying and facing a conductive trace on a mounting substrate;
    aligning the solder bump and the conductive trace such that the solder bump is approximately centered over the conductive trace;
    bringing the solder bump into physical contact with the conductive trace; and
    heating the solder bump to a temperature approximately in a range of 183° C. to less than 250° C., wherein a eutectic liquidus solder composed of the second tin layer and a portion of the lead layer is formed at a surface of the solder bump, wherein the eutectic liquidus solder wets to the conductive trace to join the semiconductor device to the mounting substrate.

12. The method of claim 1, wherein the step of positioning the semiconductor device is further characterized as positioning the solder bump having a first area overlying and facing a conductive trace having a second area which is approximately in a range of 10% to 20% of the first area.

13. The method of claim 1, wherein the step providing the semiconductor device is further characterized as providing a semiconductor device having a second lead layer interposed between the first tin layer and the second metal layer, the second lead layer being in an approximate ratio of 4 parts lead to 6 parts tin with respect to the first tin layer.

* * * * *